United States Patent
Jiang et al.

(10) Patent No.: US 12,500,569 B1
(45) Date of Patent: Dec. 16, 2025

(54) LONGITUDINALLY COUPLED RESONATOR TYPE SURFACE ACOUSTIC WAVE FILTER AND ELASTIC WAVE FILTER

(71) Applicant: Tiantong Ruihong Technology Co., Ltd., Jiaxing (CN)

(72) Inventors: Jianli Jiang, Jiaxing (CN); Yangyang Ma, Jiaxing (CN); Dan Liang, Jiaxing (CN); Qingsong Liao, Jiaxing (CN)

(73) Assignee: Tiantong Ruihong Technology Co., Ltd. (CN)

( * ) Notice: Subject to any disclaimer, the term of this patent is extended or adjusted under 35 U.S.C. 154(b) by 0 days.

(21) Appl. No.: 19/090,319

(22) Filed: Mar. 25, 2025

(30) Foreign Application Priority Data

Jun. 17, 2024 (CN) .......................... 202410773644.8

(51) Int. Cl.
*H03H 9/02* (2006.01)
*H03H 9/64* (2006.01)

(52) U.S. Cl.
CPC .... *H03H 9/02952* (2013.01); *H03H 9/02637* (2013.01); *H03H 9/02992* (2013.01); *H03H 9/6433* (2013.01)

(58) Field of Classification Search
CPC ........... H03H 9/02952; H03H 9/02637; H03H 9/02992; H03H 9/6433
USPC ................................................. 333/193–196
See application file for complete search history.

(56) References Cited

U.S. PATENT DOCUMENTS

| | | | |
|---|---|---|---|
| 6,335,667 | B1 | 1/2002 | Takagi et al. |
| 9,257,962 | B2 * | 2/2016 | Ikeuchi ................. H10N 30/87 |
| 2008/0079512 | A1 | 4/2008 | Nakazawa et al. |
| 2015/0244348 | A1 * | 8/2015 | Damy ................ H03H 9/14547 |
| | | | 333/195 |

(Continued)

FOREIGN PATENT DOCUMENTS

| | | |
|---|---|---|
| CN | 1744433 A | 3/2006 |
| CN | 103078603 A | 5/2013 |

(Continued)

OTHER PUBLICATIONS

Liu, P. et al., "Near 6-GHz Longitudinal Leaky SAW Filters with Spurious Mitigation on LiNbO3/SiO2/SiC Platform", IEEE, pp. 61-64, May 29, 2024.

(Continued)

*Primary Examiner* — Jorge L Salazar, Jr.
(74) *Attorney, Agent, or Firm* — Bochner PLLC; Andrew D. Bochner (57) ABSTRACT

The present disclosure discloses a longitudinally coupled resonator type surface acoustic wave filter and an elastic wave filter. The longitudinally coupled resonator type surface acoustic wave filter includes: a signal terminal, a ground terminal, and an interdigital transducer group. The interdigital transducer group includes at least a first interdigital transducer and a second interdigital transducer arranged along a first direction. The first interdigital transducer includes a first busbar, and the second interdigital transducer includes a second busbar. The first busbar is electrically connected to the signal terminal via a signal line, and the second busbar is electrically connected to the ground terminal via a first ground line. The first ground line does not overlap with the signal line.

4 Claims, 5 Drawing Sheets

(56) References Cited

U.S. PATENT DOCUMENTS

2017/0244383 A1  8/2017  Yasuda

FOREIGN PATENT DOCUMENTS

| CN | 116318042 A | 6/2023 |
| CN | 116545410 A | 8/2023 |
| CN | 116566357 A | 8/2023 |
| JP | H1093384 A | 4/1998 |

OTHER PUBLICATIONS

Notification to Grant Patent Right for Invention of the China Patent Office in related Chinese Appl. No. 202410773644.8, dated Jul. 22, 2024, 9 pages.

Peifeng, P., "Research on Characteristic of the Surface Acoustic Wave Pressure Sensor Based on AlN Single Crystal", Journal of Anhui Vocational College of Electronics & Information Technology, vol. 18 Issue No. 105, Jun. 2019, 5 pages.

Qiu-Liang, L. et al., "Principle and Design of Surface Acoustic Wave Synchronous Resonator", Telecom Power Technology, vol. 37 Issue No. 9, pp. 70-71, May 10, 2020.

Xiaojun, T. et al., "Investigation of Spuressing Spurious Response of Transversal Coupling Resonator Filter", Piezoelectrics & Acoustooptics, vol. 33 Issue No. 2, pp. 165-173, Apr. 2011.

\* cited by examiner

LONGITUDINALLY COUPLED RESONATOR TYPE SURFACE ACOUSTIC WAVE FILTER AND ELASTIC WAVE FILTER

CROSS-REFERENCE TO RELATED APPLICATION

The present disclosure claims priority to Chinese patent Application No. 2024107736448, filed with the Chinese Patent Office on Jun. 17, 2024, entitled "LONGITUDINALLY COUPLED resonator type SURFACE ACOUSTIC WAVE FILTER AND ELASTIC WAVE FILTER", the entire contents of which are incorporated herein by reference.

TECHNICAL FIELD

The present disclosure relates to the technology field of Radio Frequency filters, and particularly, to a longitudinally coupled resonator type surface acoustic wave filter and an elastic wave filter.

BACKGROUND ART

Surface acoustic wave filter devices, as one of the important components in the Radio Frequency front-end field, are widely applied in the communication field. With the rapid development of Radio Frequency communication technology, higher performance requirements are proposed for the surface acoustic wave filters.

At present, in order to reduce the size of the filter, compared with the traditional ladder surface acoustic wave filter, a longitudinally coupled resonator type surface acoustic wave filter is provided. However, in the longitudinally coupled resonator type surface acoustic wave filter, a dielectric bridge is typically introduced during the layout of the filter chip, which occupies an additional area of the filter chip and affects the further miniaturization of the filter chip volume. Secondly, due to the presence of the dielectric bridge, parasitic capacitance effect is introduced into the filter circuit, which deteriorates the insertion loss in the passband and the out-of-band attenuation of the filter.

SUMMARY

The embodiments of the present disclosure provide a longitudinally coupled resonator type surface acoustic wave filter and an elastic wave filter, to reduce parasitic capacitance, improve the performance of the longitudinally coupled resonator type surface acoustic wave filter, and enable miniaturization of the filter.

In a first aspect, the embodiment of the present disclosure provides a longitudinally coupled resonator type surface acoustic wave filter, including a signal terminal, a ground terminal, and an interdigital transducer group;
  the interdigital transducer group includes at least a first interdigital transducer and a second interdigital transducer arranged along a first direction; the first interdigital transducer includes a first busbar, and the second interdigital transducer includes a second busbar;
  the first busbar is electrically connected to the signal terminal via a signal line, and the second busbar is electrically connected to the ground terminal via a first ground line; and the first ground line and the signal line do not overlap.
Optionally, the first busbar and the second busbar are arranged in the first direction;
  the first interdigital transducer further includes a third busbar; the third busbar and the first busbar are arranged along a second direction; the third busbar is electrically connected to the ground terminal via a second ground line; the second direction intersects with the first direction.
The longitudinally coupled resonator type surface acoustic wave filter further includes at least one electrode finger; the electrode finger extends along the second direction; one end of the electrode finger is electrically connected to the second busbar; and the other end of the electrode finger is electrically connected to the third busbar.
Optionally, the second interdigital transducer further includes a fourth busbar, wherein the fourth busbar is arranged with the second busbar along the second direction and is arranged with the third busbar along the first direction.
The signal terminal includes a first signal terminal and a second signal terminal, wherein the first busbar is electrically connected to the first signal terminal via a first signal line, and the fourth busbar is electrically connected to the second signal terminal via a second signal line; the first signal terminal is an input signal terminal, and the second signal terminal is an output signal terminal; or, the first signal terminal is an output signal terminal, and the second signal terminal is an input signal terminal.
Optionally, the longitudinally coupled resonator type surface acoustic wave filter includes at least two first interdigital transducers and at least one second interdigital transducer. Along the first direction, the second interdigital transducer is located between two adjacent first interdigital transducers;
  the first busbars of the two first interdigital transducers are electrically connected to the signal terminal via the same signal line; and
  the second busbar is electrically connected to at least one third busbar via the electrode finger.
Optionally, along the first direction, a gap is arranged between the first busbar and the second busbar, and a gap is arranged between the third busbar and the fourth busbar.
Optionally, the second interdigital transducer further includes a fourth busbar, wherein the fourth busbar is arranged with the second busbar along the second direction, and is arranged with the first busbar along the first direction; the second direction intersects with the first direction.
The signal terminal includes a first signal terminal and a second signal terminal, wherein the first busbar is electrically connected to the first signal terminal via a first signal line, and the fourth busbar is electrically connected to the second signal terminal via a second signal line; the first signal terminal is an input signal terminal, and the second signal terminal is an output signal terminal; or, the first signal terminal is an output signal terminal, and the second signal terminal is an input signal terminal.
Optionally, along the thickness direction of the longitudinally coupled resonator type surface acoustic wave filter, an overlapping portion is arranged between the first signal line and the second signal line.
The longitudinally coupled resonator type surface acoustic wave filter further includes a dielectric bridge,
  wherein along the thickness direction of the longitudinally coupled resonator type surface acoustic wave filter, the dielectric bridge is located between the first signal line and the second signal line, and the dielectric bridge covers the overlapping portion.
Optionally, the first interdigital transducer further includes a third busbar, wherein the third busbar is arranged with the first busbar along the second direction, and is arranged with the second busbar along the first direction.

The third busbar is connected to the second busbar.

Optionally, the longitudinally coupled resonator type surface acoustic wave filter further includes a reflector, wherein along the first direction, the reflector is located on at least one side of the interdigital transducer group, and the reflector is electrically connected to the ground terminal.

In a second aspect, the embodiment of the present disclosure further provides an elastic wave filter, including any of the longitudinally coupled resonator type surface acoustic wave filters described in the first aspect, wherein the longitudinally coupled resonator type surface acoustic wave filter is arranged in series in a loop between the first signal terminal and the second signal terminal.

The elastic wave filter further includes at least one series arm resonator and at least one parallel arm resonator, wherein the series arm resonator is arranged in series in the loop between the first signal terminal and the second signal terminal, one end of the parallel arm resonator is arranged in the loop between the first signal terminal and the second signal terminal, and the other end is electrically connected to the ground terminal.

The technical solution of the embodiment of the present disclosure provides a longitudinally coupled resonator type surface acoustic wave filter including a signal terminal, a ground terminal, and an interdigital transducer group. The interdigital transducer group includes at least a first interdigital transducer and a second interdigital transducer arranged along the first direction, wherein the first busbar of the first interdigital transducer is electrically connected to the signal terminal via a signal line, and the second busbar of the second interdigital transducer is electrically connected to the ground terminal via a first ground line, and the first ground line does not overlap with the signal line. That is, the embodiment of the present disclosure eliminates the need to provide a dielectric bridge between the signal line and the first ground line, which enables miniaturization of the longitudinally coupled resonator type surface acoustic wave filter on the one hand and reduces the parasitic capacitance effect in the filter circuit on the other hand, thereby improving the performance of the filter.

DETAILED DESCRIPTION OF EMBODIMENTS

The present disclosure will be further described in detail below in conjunction with the drawings and embodiments. It can be understood that the specific embodiments described herein are only intended to explain the present disclosure, rather than to limit the present disclosure. Additionally, it should be noted that, for ease of description, only the portions related to the present disclosure are shown in the drawings, rather than the entire structure.

Figure 1:
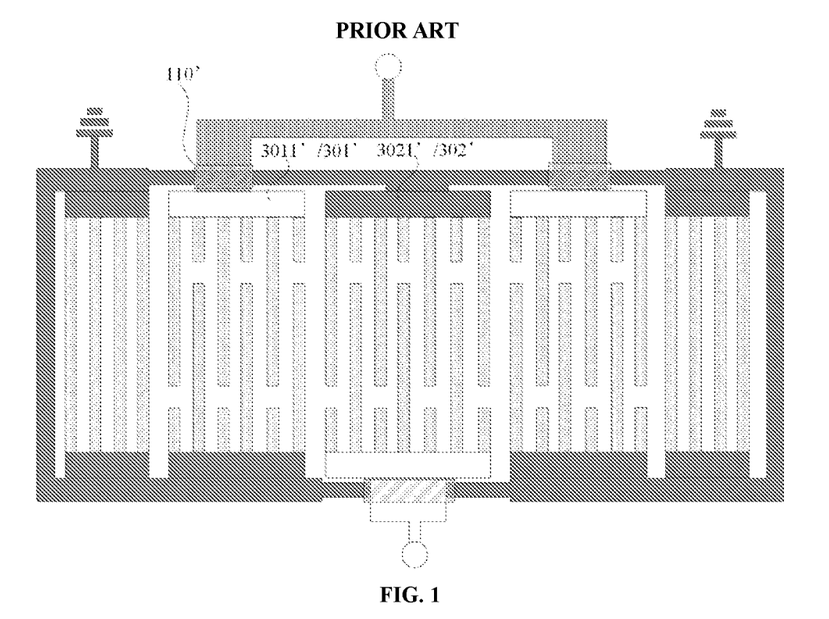
FIG. 1 is a structural schematic diagram of a longitudinally coupled resonator type surface acoustic wave filter in the prior art.

Before detailing the technical solutions of the embodiments of the present disclosure, the longitudinally coupled resonator type surface acoustic wave filter in the prior art is first described. FIG. 1 is a structural schematic diagram of a longitudinally coupled resonator type SAW filter in the prior art. As shown in FIG. 1, the first busbar 3011F of the first interdigital transducer 301' is electrically connected to the input signal terminal via a signal line, and the second busbar 3021' of the second interdigital transducer 302' is electrically connected to the ground terminal via a ground line that extends to a solder ball region on the periphery of the chip. A dielectric bridge 110' is required to isolate the signal line from the ground line to prevent short circuits. Due to the presence of the dielectric bridge, there is a significant potential difference between the signal line and the ground line, resulting in a large parasitic capacitance effect, which in turn affects the performance of the device. Furthermore, the dielectric bridge increases the volume of the chip, which is not conducive to achieving a miniaturized configuration.

To address the above technical issues, the embodiments of the present disclosure enable a structural configuration for the longitudinally coupled resonator type surface acoustic wave filter, which can eliminate overlap between the ground line and the signal line, thereby eliminating the dielectric bridge. This reduces the parasitic capacitance effect, improves the performance of the filter device, and additionally enables a miniaturized configuration of the filter device. Next, the technical solutions of the embodiments of the present disclosure will be described in detail.

Figure 2:
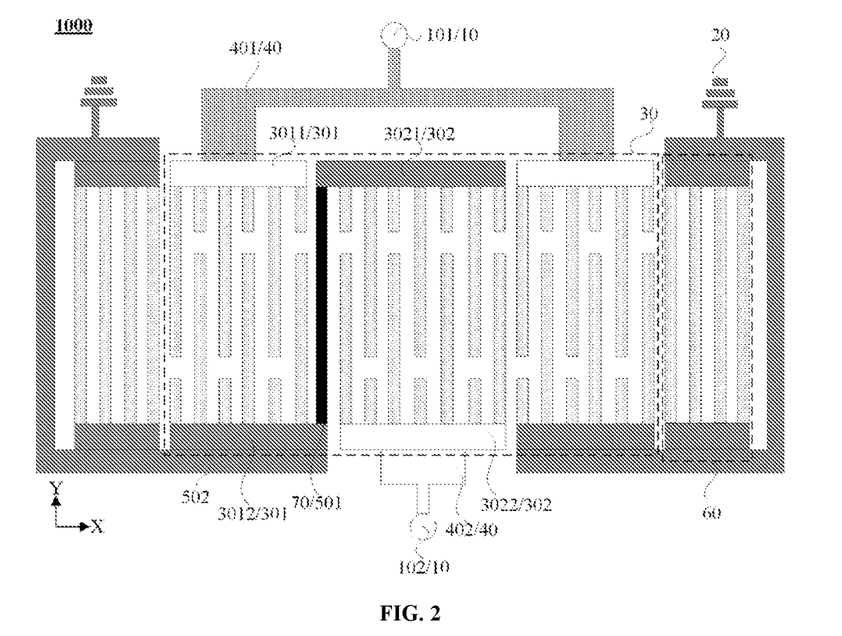
FIG. 2 is a structural schematic diagram of a first longitudinally coupled resonator type surface acoustic wave filter provided in the embodiment of the present disclosure.

FIG. 2 is a structural schematic diagram of a first longitudinally coupled resonator type surface acoustic wave filter provided in the embodiment of the present disclosure. As shown in FIG. 2, the longitudinally coupled resonator type surface acoustic wave filter 1000 includes: a signal terminal 10, a ground terminal 20, and an interdigital transducer group 30. The interdigital transducer group 30 includes at least a first interdigital transducer 301 and a second interdigital transducer 302 arranged along a first direction (the X-direction as shown in the figure). The first interdigital transducer 301 includes a first busbar 3011, and the second interdigital transducer 302 includes a second busbar 3021. The first busbar 3011 is electrically connected to the signal terminal 10 via a signal line 40, and the second busbar 3021 is electrically connected to the ground terminal 20 via a first ground line 501. The first ground line 501 does not overlap with the signal line 40.

Specifically, the interdigital transducer group 30 includes at least a first interdigital transducer 301 and a second interdigital transducer 302 arranged along the first direction X. Exemplarily, assuming the interdigital transducer group 30 includes three interdigital transducers, it can be understood that one of the two first interdigital transducers 301 can be arranged at the edge position on each side of the longitudinally coupled resonator type surface acoustic wave filter 1000, and the second interdigital transducer 302 is located in the middle position between the two first interdigital transducers 301.

Specifically, the signal terminal 10 includes a first signal terminal 101 and a second signal terminal 102, which are the input signal terminal and the output signal terminal, respectively. The signal line 40 includes a first signal line 401 and a second signal line 402. The signal line connected to the input signal terminal can be understood as the signal input line, and the signal line connected to the output signal terminal can be understood as the signal output line.

Specifically, the first busbar 3011 in the first interdigital transducer 301 is electrically connected to the first signal terminal 101 via the first signal line 401. The first interdigital transducer 301 can also include a third busbar 3012, and the third busbar 3012 is electrically connected to the ground terminal 20 via a second ground line 502. The second busbar 3021 in the second interdigital transducer 302 is electrically connected to the ground terminal 20 via the first ground line 501. The second interdigital transducer 302 can further include a fourth busbar 3022, and the fourth busbar 3022 is electrically connected to the second signal terminal 102 via the second signal line 402. In other words, the first busbar 3011 can be electrically connected to the input signal terminal via the signal input line, and the fourth busbar 3022 can be electrically connected to the output signal terminal via the signal output line; or, the first busbar 3011 can also be electrically connected to the output signal terminal via the signal output line, and the fourth busbar 3022 can be electrically connected to the input signal terminal via the signal input line. In this way, the input signal enters from the input signal terminal and is output through the output signal terminal, thereby achieving the functionality of the longitudinally coupled resonator type surface acoustic wave filter.

Specifically, when an alternating current signal of a frequency is applied to the busbar, a surface acoustic wave signal is generated within the longitudinally coupled resonator type surface acoustic wave filter. The surface acoustic wave signal primarily concentrates in the effective aperture region and propagates mainly along the first direction X. Different surface acoustic wave signals generated by various interdigital transducers interact with each other through coupling.

Furthermore, the first ground line 501 does not overlap with the first signal line 401, and the first ground line 501 does not overlap with the second signal line 402. That is, there is no need to arrange a dielectric bridge between the first ground line 501 and the signal input line, and there is no need to arrange a dielectric bridge between the first ground line 501 and the signal output line. Thus, there is no need to take into account the large potential difference between the signal lines and the ground line above and below the dielectric bridge. This reduces parasitic capacitance effect, thereby improving the performance of the longitudinally coupled resonator type surface acoustic wave filter. Additionally, without the arrangement of the dielectric bridge, the size of the longitudinally coupled resonator type surface acoustic wave filter along the second direction (the Y-direction as shown in the figure) can be reduced.

Optionally, as shown in FIG. 2, the longitudinally coupled resonator type surface acoustic wave filter 1000 further includes a reflector 60. Along the first direction X, the reflector 60 is located on at least one side of the interdigital transducer group 30, and the reflector 60 is electrically connected to the ground terminal 20.

Specifically, by arranging the reflector 60 on one or both sides of the interdigital transducer group 30 along the first direction X, when the surface acoustic wave propagates along the first direction X, the surface acoustic wave that are about to leak can be reflected back into the effective aperture region, i.e., the active region. This reduces the leakage of surface acoustic wave and improves the Q-factor of the longitudinally coupled resonator type surface acoustic wave filter.

In the longitudinally coupled resonator type surface acoustic wave filter provided in the embodiments of the present disclosure, the first busbar of the first interdigital transducer is electrically connected to the signal terminal via a signal line, the second busbar of the second interdigital transducer is electrically connected to the ground terminal via a first ground line, and the first ground line does not overlap with the signal line. That is, the embodiment of the present disclosure eliminates the need to provide a dielectric bridge between the signal line and the first ground line, which enables miniaturization of the longitudinally coupled resonator type surface acoustic wave filter on the one hand and reduces the parasitic capacitance effect in the filter circuit on the other hand, thereby improving the performance of the filter.

Optionally, as shown in FIG. 2, the first busbar 3011 and the second busbar 3021 are arranged along the first direction X. The first interdigital transducer 301 further includes a third busbar 3012. The third busbar 3012 and the first busbar 3011 are arranged along the second direction (the Y-direction as shown in the figure). The third busbar 3012 is electrically connected to the ground terminal 20 via the second ground line 502. The second direction Y intersects with the first direction X. The longitudinally coupled resonator type surface acoustic wave filter 1000 also includes at least one electrode finger 70. The electrode finger 70 extends along the second direction Y, wherein one end of the electrode finger 70 is electrically connected to the second busbar 3021 and the other end of the electrode finger 70 is electrically connected to the third busbar 3012.

Specifically, the first busbar 3011 and the third busbar 3012 are arranged along the second direction Y and are electrically connected to the interdigital electrodes within the first interdigital transducer 301. The first busbar 3011 can be electrically connected to the input signal terminal via the signal input line, and the third busbar 3012 is electrically connected to the ground terminal 20 via the second ground line 502. The second busbar 3021 and the fourth busbar 3022 are arranged along the second direction Y and are electrically connected to the interdigital electrodes within the second interdigital transducer 302.

Specifically, the second busbar 3021 and the third busbar 3012 are located on two sides of the interdigital electrodes, respectively. Therefore, the second busbar 3021 is electrically connected to the third busbar 3012 through the electrode finger 70, meaning that the second busbar 3021 is grounded via the electrode finger 70. This eliminates the need for a ground line to connect the second busbar 3021 to the ground terminal 20 from above, ensuring no overlap between the signal input line and the ground line and no overlap between the signal output line and the ground line. In other words, there is no need to arrange a dielectric bridge between the ground line and the signal input line, and between the ground line and the signal output line, thus reducing parasitic capacitance effect and enhancing the performance of the longitudinally coupled resonator type surface acoustic wave filter.

Additionally, as a comparison, in the prior art, dielectric bridges are arranged between the ground line and the signal line, which increases the complexity of the chip manufacturing process. Ground interconnects are typically laid out across the dielectric bridge, and the interconnects have steps at the edges of the dielectric bridge, which often leads to reliability risks, such as fractures. Therefore, by arranging the electrode finger, the embodiment of the present disclosure, on the one hand, simplifies the manufacturing of the longitudinally coupled resonator type surface acoustic wave filter, and on the other hand, it enhances the stability of the filter.

It should be noted that the electrode finger 70 can be understood as a conductive electrode, and the electrode finger 70 extends along the second direction Y. This enables the communication between the second busbar 3021 and the third busbar 3012, thus achieving grounding.

It is also understood that the interdigital electrodes can include dummy finger electrodes and real finger electrodes, i.e., short-finger electrodes and long-finger electrodes, respectively. The dummy electrodes and real electrodes are alternately arranged along the first direction X and extend along the second direction Y. Along the first direction X, the overlapping region of the real electrodes is understood to be the effective aperture region, i.e., the active region.

Figure 3:
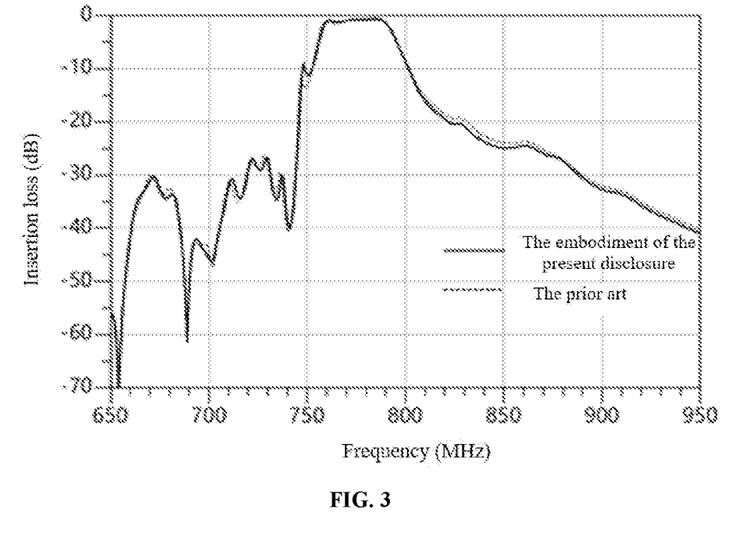
FIG. 3 is a transmission characteristic curve diagram of a longitudinally coupled resonator type surface acoustic wave filter in FIG. 2 at an 800 MHz frequency band.
Figure 4:
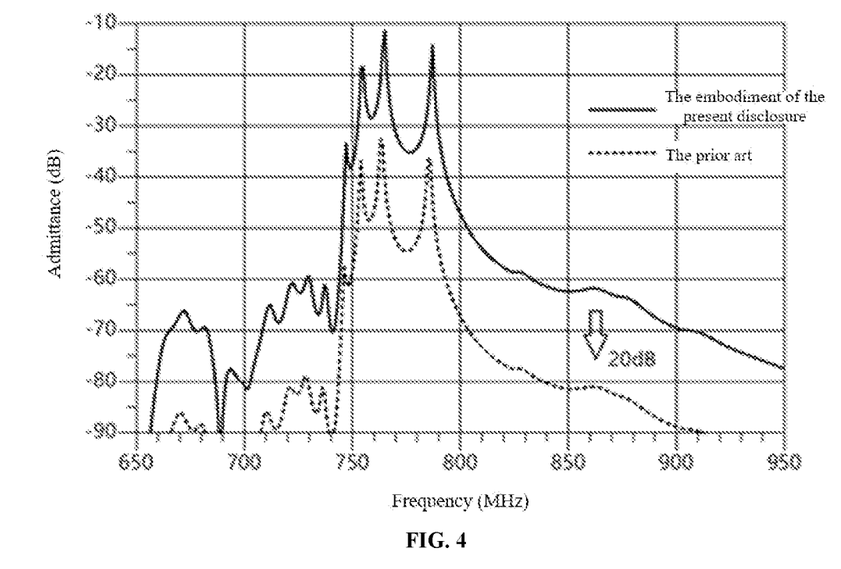
FIG. 4 is an admittance characteristic curve diagram of a longitudinally coupled resonator type surface acoustic wave filter in FIG. 2 at an 800 MHz frequency band.

FIG. 3 is a transmission characteristic curve diagram of a longitudinally coupled resonator type surface acoustic wave filter in FIG. 2 at an 800 MHz frequency band. As shown in FIG. 3, the dashed line is the transmission characteristics curve of the longitudinally coupled resonator type surface acoustic wave filter from the prior art, and the solid line is the transmission characteristics curve of the longitudinally coupled resonator type surface acoustic wave filter provided by the embodiment of the present disclosure. By comparing the transmission characteristic curves of the prior art and the embodiment of the present disclosure, it can be observed that the electrical characteristic curves of both filters are essentially consistent. This indicates that, by replacing the dielectric bridge with the electrode finger in the embodiment of the present disclosure, the chip size can be reduced without degrading characteristics such as in-band insertion loss and out-of-band attenuation of the filter. FIG. 4 is an admittance characteristic curve diagram of a longitudinally coupled resonator type surface acoustic wave filter in FIG. 2 at an 800 MHz frequency band. As shown in FIG. 4, the dashed line is the admittance characteristic curve of the longitudinally coupled resonator type surface acoustic wave filter from the prior art, and the solid line is the admittance characteristic curve of the longitudinally coupled resonator type surface acoustic wave filter provided by the embodiment of the present disclosure. To distinguish between the two, the amplitude of the admittance characteristic curve of the prior art is shifted downward by 20 dB. It is evident that the admittance characteristic curves of both filters are essentially consistent, and the admittance characteristic peaks within the passband of the filters are consistent. This demonstrates that the embodiment of the present disclosure reduces the chip size of the filter without affecting characteristics such as pass-band insertion loss or out-of-band attenuation of the filter.

Optionally, referring to FIG. 2, the second interdigital transducer 302 also includes a fourth busbar 3022. The fourth busbar 3022 is arranged with the second busbar 3021 along the second direction Y, and is arranged with the third busbar 3012 along the first direction X. The signal terminal 10 includes a first signal terminal 101 and a second signal terminal 102, wherein the first busbar 3011 is electrically connected to the first signal terminal 101 via a first signal line 401, and the fourth busbar 3022 is electrically connected to the second signal terminal 102 via a second signal line 402; the first signal terminal 101 is an input signal terminal, and the second signal terminal 102 is an output signal terminal; or, the first signal terminal 101 is an output signal terminal, and the second signal terminal 102 is an input signal terminal.

Specifically, the fourth busbar 3022 and the second busbar 3021 are arranged along the second direction Y, and the fourth busbar 3022 and the third busbar 3012 are arranged along the first direction X. In other words, the fourth busbar 3022 and the third busbar 3012 are located on the same side of the interdigital electrode, and the first busbar 3011 and the second busbar 3021 are located on the other side of the interdigital electrode. In other words, the first busbar 3011 can be electrically connected to the input signal terminal via the signal input line, and the fourth busbar 3022 can be electrically connected to the output signal terminal via the signal output line; or, the first busbar 3011 can also be electrically connected to the output signal terminal via the signal output line, and the fourth busbar 3022 can be electrically connected to the input signal terminal via the signal input line. It is beneficial to ensure that the signals are input to the interdigital transducer from the input signal terminal and output from the output signal terminal, and the second busbar 3021 is electrically connected to the third busbar 3012 via the electrode finger 70. Thus, the grounding effect of the second busbar 3021 can be achieved, which enables the functionality of the longitudinally coupled resonator type surface acoustic wave filter.

Figure 5:
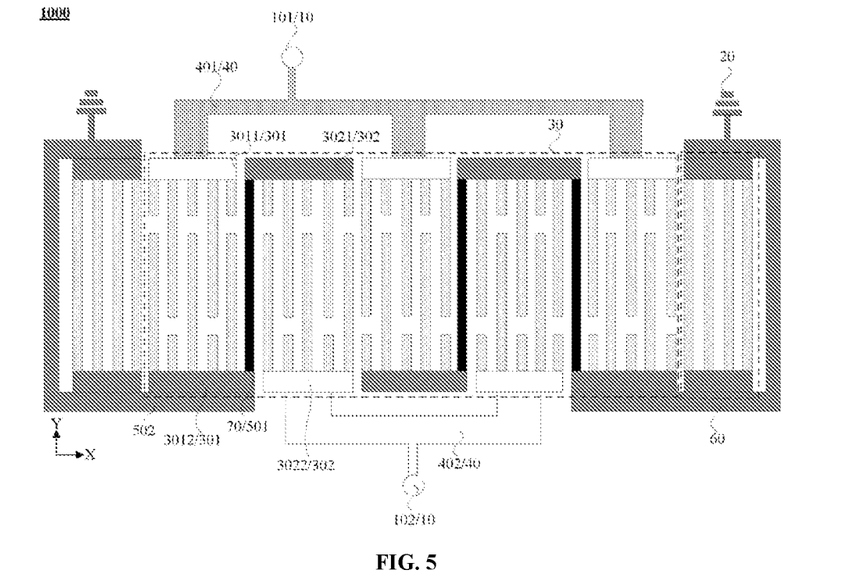
FIG. 5 is a structural schematic diagram of a second longitudinally coupled resonator type surface acoustic wave filter provided in the embodiment of the present disclosure.

FIG. 5 is a structural schematic diagram of a second longitudinally coupled resonator type surface acoustic wave filter provided in the embodiment of the present disclosure. Optionally, referring to FIGS. 2 and 5, the longitudinally coupled resonator type surface acoustic wave filter 1000 includes at least two first interdigital transducers 301 and at least one second interdigital transducer 302. Along the first direction X, the second interdigital transducer 302 is located between two adjacent first interdigital transducers 301; the first busbars 3011 of the two first interdigital transducers 301 are electrically connected to the signal terminal 10 via the same signal line 40; and the second busbar 3021 is electrically connected to at least one third busbar 3012 via the electrode finger 70.

In one possible implementation, referring to FIG. 2, the longitudinally coupled resonator type surface acoustic wave filter includes two first interdigital transducers 301 and a second interdigital transducer 302, meaning that the longitudinally coupled resonator type surface acoustic wave filter 1000 includes a three-order interdigital transducer. Specifically, the first busbars 3011 of the two first interdigital transducers 301 are electrically connected to the first signal terminal 101 via the same first signal line 401, and the second busbar 3021 is electrically connected to the third busbar 3012 via the electrode finger 70, thereby achieving electrical connection of the second busbar 3021 to the ground terminal 20.

It should be noted that FIG. 2 illustrates only the technical solution where the second busbar 3021 is electrically connected to the left-side third busbar 3012 via the electrode finger 70. It is understood that the second busbar 3021 can also be connected to the right-side third busbar 3012 via the electrode finger 70; or, the second busbar 3021 can be connected to the third busbar 3012 located on the left side of the second interdigital transducer 302 through one electrode finger 70, and to the third busbar 3012 located to the right side of the second interdigital transducer 302 via another electrode finger 70. This further ensures the grounding effect of the second busbar 3021.

In another feasible implementation, referring to FIG. 5, the longitudinally coupled resonator type surface acoustic wave filter includes three first interdigital transducers 301 and two second interdigital transducers 302. The first interdigital transducers 301 and second interdigital transducers 302 are alternately arranged along the first direction X, meaning that the longitudinally coupled resonator type surface acoustic wave filter 1000 includes a five-order interdigital transducer. Specifically, the first busbars 3011 of the three first interdigital transducers 301 are electrically connected to the first signal terminal 101 via the same first signal line 401. Two fourth busbars 3022 are electrically connected to the second signal terminal 102 via the same second signal line 402, and the second busbars 3021 are electrically connected to the third busbars 3012 via multiple electrode fingers 70, thus ensuring the grounding effect of the second busbars 3021.

It should be noted that the number of order of the interdigital transducers can also be four, six, seven, nine, and so on.

Optionally, referring to FIG. 2 or 5, along the first direction X, a gap is arranged between the first busbar 3011 and the second busbar 3021, and a gap is arranged between the third busbar 3012 and the fourth busbar 3022. In other words, the first busbar 3011 is insulated from the second busbar 3021, and the third busbar 3012 is insulated from the fourth busbar 3022. This prevents short circuits caused by the communications between any two adjacent busbars along the first direction X, thereby preserving the performance of the longitudinally coupled resonator type surface acoustic wave filter.

Figure 6:
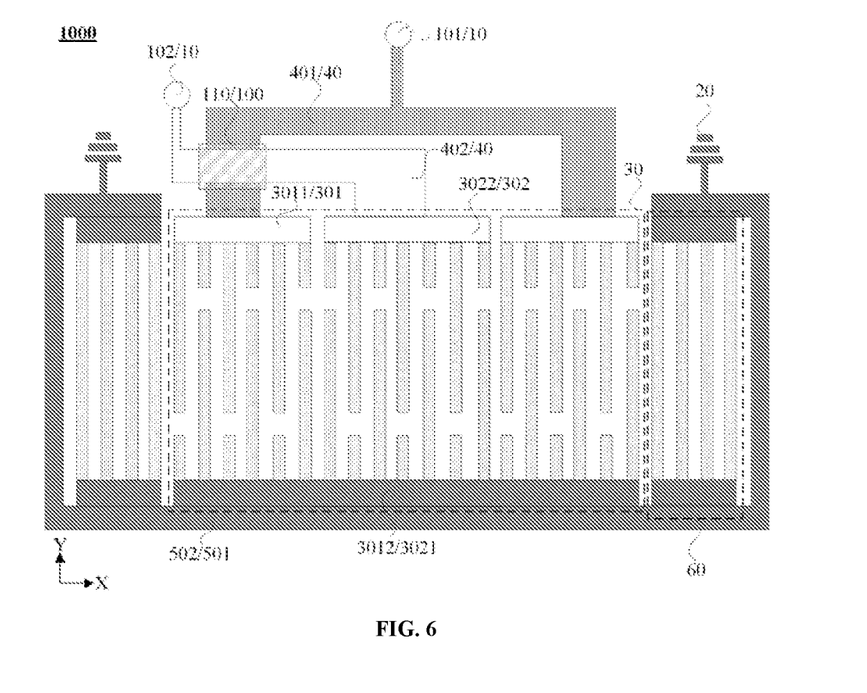
FIG. 6 is a structural schematic diagram of a third longitudinally coupled resonator type surface acoustic wave filter provided in the embodiment of the present disclosure.

Optionally, FIG. 6 is a structural schematic diagram of a third longitudinally coupled resonator type surface acoustic wave filter provided in the embodiment of the present disclosure. As shown in FIG. 6, the second interdigital transducer 302 further includes a fourth busbar 3022, wherein the fourth busbar 3022 is arranged with the second busbar 3021 along the second direction Y and is arranged with the first busbar 3011 along the first direction X; and the second direction Y intersects with the first direction X. The signal terminal 10 includes a first signal terminal 101 and a second signal terminal 102, wherein the first busbar 3011 is electrically connected to the first signal terminal 101 via a first signal line 401, and the fourth busbar 3022 is electrically connected to the second signal terminal 102 via a second signal line 402; the first signal terminal 101 is an input signal terminal, and the second signal terminal 102 is an output signal terminal; or, the first signal terminal 101 is an output signal terminal, and the second signal terminal 102 is an input signal terminal.

Specifically, the second interdigital transducer 302 includes the fourth busbar 3022. The fourth busbar 3022 is arranged with the second busbar 3021 along the second direction Y, and is arranged with the first busbar 3011 along the first direction X. In other words, the first busbar 3011 and the fourth busbar 3022 are located on the same side of the interdigital electrode, and the second busbar 3021 and the third busbar 3012 are located on the other side of the interdigital electrode.

In one possible implementation, the first busbar 3011 is connected to the input signal terminal via the signal input line, and the fourth busbar 3022 is connected to the output signal terminal via the signal output line. Along the thickness direction of the longitudinally coupled resonator type surface acoustic wave filter, an overlapping portion 100 is provided between the signal input line and the signal output line.

In another possible implementation, the first busbar 3011 is connected to the output signal terminal via the signal output line, and the fourth busbar 3022 is connected to the input signal terminal via the signal input line. Along the thickness direction of the longitudinally coupled resonator type surface acoustic wave filter, an overlapping portion 100 is provided between the signal input line and the signal output line.

It should be noted that the third busbar 3012 and the second busbar 3021 can be connected as a whole and electrically connected to the ground terminal 20 via a ground line. This arrangement is simple and offers high stability.

Optionally, referring to FIG. 6, along the thickness direction of the longitudinally coupled resonator type surface acoustic wave filter, an overlapping portion 100 is arranged between the first signal line 401 and the second signal line 402. The longitudinally coupled resonator type surface acoustic wave filter 1000 further includes a dielectric bridge 110, wherein along the thickness direction of the longitudinally coupled resonator type surface acoustic wave filter, the dielectric bridge 110 is located between the first signal line 401 and the second signal line 402, and the dielectric bridge 110 covers the overlapping portion 100.

Specifically, in the thickness direction of the longitudinally coupled resonator type surface acoustic wave filter, an overlapping portion 100 is provided between the first signal line 401 and the second signal line 402. That is, an overlapping portion 100 is provided between the signal input line and the signal output line. By providing a dielectric bridge 110 between the first signal line 401 and the second signal line 402, signal crosstalk between the signal input line and the signal output line can be prevented.

Further, in the thickness direction of the longitudinally coupled resonator type surface acoustic wave filter, the dielectric bridge 110 covers the overlapping portion 100, thereby further ensuring the insulating effect between the signal input line and the signal output line and further isolating signal crosstalk.

It should be noted that, as a comparison, referring to FIG. 1, in the prior art, the dielectric bridge is provided between the signal line and the ground line. In this case, the potential difference between the signal line and the ground line is large, which means that the parasitic capacitance is large. Additionally, for a three-order interdigital transducer, in the prior art, two dielectric bridges are provided between the signal input line and the ground line. However, in the embodiment of the present disclosure, the dielectric bridge is provided between the signal input line and the signal output line, and only one dielectric bridge is included. This arrangement, on one hand, reduces the number of dielectric bridges, simplifying the process, and on the other hand, ensures a smaller potential difference between the signal input line and the signal output line, thereby reducing parasitic capacitance effect, improving the performance of the longitudinally coupled resonator type surface acoustic wave filter, and reducing the filter chip size.

It can be understood that the material of the dielectric bridge 110 can be an insulating material, such as $SiO_2$, SiN, or polyimide, to provide signal isolation.

Figure 7:
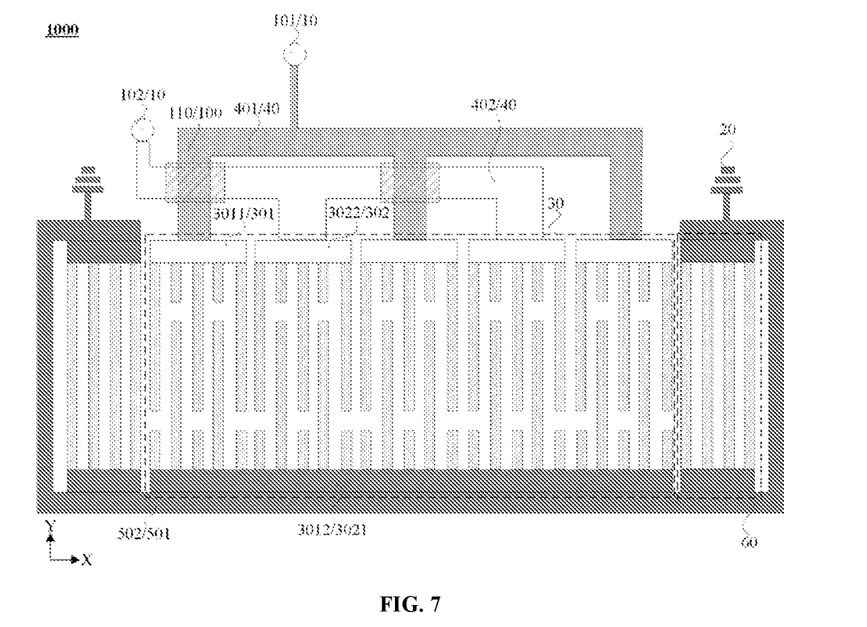
FIG. 7 is a structural schematic diagram of a fourth longitudinally coupled resonator type surface acoustic wave filter provided in the embodiment of the present disclosure.

FIG. 7 is a structural schematic diagram of a fourth longitudinally coupled resonator type surface acoustic wave filter provided in the embodiment of the present disclosure. As shown in FIG. 7, the longitudinally coupled resonator type surface acoustic wave filter 1000 includes a five-order interdigital transducer. The first busbars 3011 of the three first interdigital transducers 301 are electrically connected to the first signal terminal 101 via the same first signal line 401. Two fourth busbars 3022 are electrically connected to the second signal terminal 102 via the same second signal line 402. Thus, in the thickness direction of the longitudinally coupled resonator type surface acoustic wave filter, the first signal line 401 and the second signal line 402 are arranged with two overlapping portions 100, that is, the signal input line and the signal output line are provided with overlapping portions 100. By providing the dielectric bridge 110 between the signal input line and the signal output line, where the dielectric bridge 110 covers the overlapping portions 100, the arrangement, compared to the prior art, not only reduces parasitic capacitance effect, thereby enhancing the performance of the longitudinally coupled resonator type surface acoustic wave filter but also reduces the number of dielectric bridges, thereby reducing the size of the filter chip.

Optionally, referring further to FIG. 7, the first interdigital transducer 301 further includes a third busbar 3012, wherein the third busbar 3012 is arranged with the first busbar 3011 along the second direction Y and is arranged with the second busbar 3021 along the first direction X. The third busbar 3012 is connected to the second busbar 3021, meaning that the third busbar 3012 and the second busbar 3021 can be connected as a whole and electrically connected to the ground terminal 20 via a ground line. This arrangement is simple and offers high stability.

In summary, a longitudinally coupled resonator type surface acoustic wave filter is provided in the embodiments of the present disclosure, wherein the first busbar of the first interdigital transducer is electrically connected to the signal terminal via a signal line, the second busbar of the second interdigital transducer is electrically connected to the ground terminal via a first ground line, and the first ground line does not overlap with the signal line. In other words, the embodiment of the present disclosure eliminates the need to provide a dielectric bridge between the signal line and the first ground line, which enables miniaturization of the longitudinally coupled resonator type surface acoustic wave filter on the one hand and reduces the parasitic capacitance effect in the filter on the other hand, thereby improving the performance of the filter.

Figure 8:
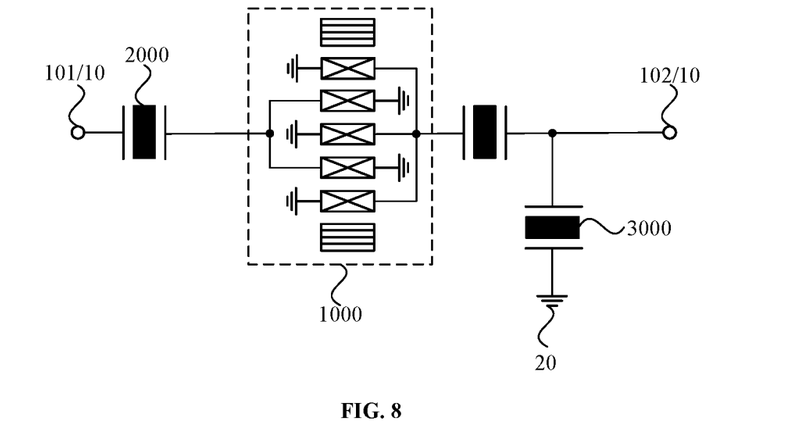
FIG. 8 is a structural schematic diagram of a first elastic wave filter provided in the embodiment of the present disclosure.

Based on the same inventive concept, the embodiments of the present disclosure also provide an elastic wave filter. FIG. 8 is a structural schematic diagram of a first elastic wave filter provided in the embodiment of the present disclosure. As shown in FIG. 8, the elastic wave filter includes the longitudinally coupled resonator type surface acoustic wave filter 1000 described in the above embodiments, wherein the longitudinally coupled resonator type surface acoustic wave filter 1000 is arranged in series in a loop between the first signal terminal 101 and the second signal terminal 102. The elastic wave filter further includes at least one series arm resonator 2000 and at least one parallel arm resonator 3000, wherein the series arm resonator 2000 is arranged in series in the loop between the first signal terminal 101 and the second signal terminal 102, one end of the parallel arm resonator 3000 is arranged in the loop between the first signal terminal 101 and the second signal terminal 102, and the other end is electrically connected to the ground terminal 20.

It can be understood that the elastic wave filter includes the longitudinally coupled resonator type surface acoustic wave filter described in the above embodiments. Therefore, the elastic wave filter provided in the embodiments of the present disclosure also has the above-mentioned advantageous effects, which will not be repeated here. Further, the longitudinally coupled resonator type surface acoustic wave filter provided in the embodiments of the present disclosure can be used in duplexers, quadplexers, or higher-order multiplexers. The longitudinally coupled resonator type filter device provided in the embodiments of the present disclosure can be used in Radio Frequency front-end module circuit systems.

Figure 9:
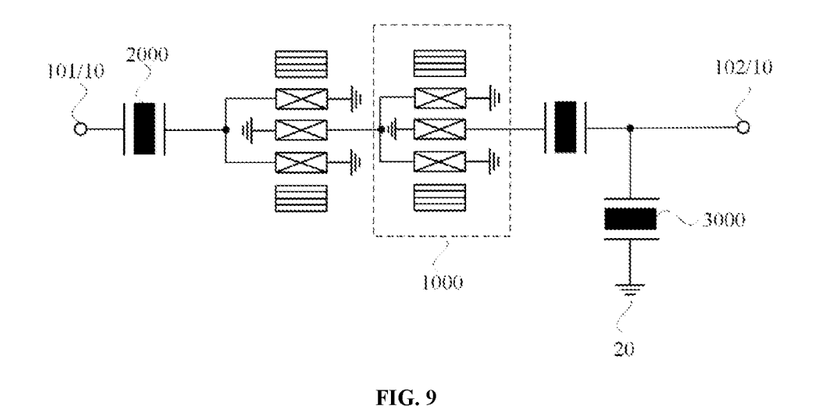
FIG. 9 is a structural schematic diagram of a second elastic wave filter provided in the embodiment of the present disclosure.

Exemplarily, FIG. 9 is a structural schematic diagram of a second elastic wave filter provided in the embodiment of the present disclosure. As shown in FIG. 9, the elastic wave filter can include at least two longitudinally coupled resonator type surface acoustic wave filters 1000 arranged in series. It can be understood that the order of the interdigital transducers in at least two longitudinally coupled resonator type surface acoustic wave filters 1000 can be the same or different; and the number and period of the interdigital electrodes in each interdigital transducer can be configured according to actual application requirements.

Figure 10:
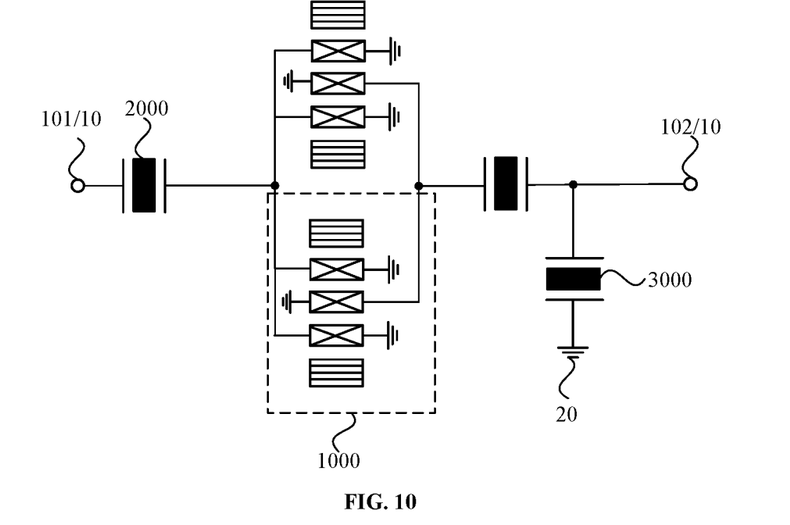
FIG. 10 is a structural schematic diagram of a third elastic wave filter provided in the embodiment of the present disclosure.

Exemplarily, FIG. 10 is a structural schematic diagram of a third elastic wave filter provided in the embodiment of the present disclosure. As shown in FIG. 10, the elastic wave filter can include at least two longitudinally coupled resonator type surface acoustic wave filters 1000 arranged in parallel. It can be understood that the order of the interdigital transducers in at least two longitudinally coupled resonator type surface acoustic wave filters 1000 can be the same or different; and the number and period of the interdigital electrodes in each interdigital transducer can be configured according to actual application requirements.

It is worth noting that the above are merely preferred embodiments and technical principles applied in the present disclosure. Those skilled in the art will understand that the present disclosure is not limited to the specific embodiments described herein. Various obvious changes, adjustments, combinations, and substitutions can be made by those skilled in the art without departing from the scope of the present disclosure. Therefore, although the present disclosure has been described in detail through the above embodiments, the present disclosure is not limited to the above embodiments. More equivalent embodiments may be included without departing from the concept of the present disclosure, and the scope of the present disclosure is determined by the appended claims.

The invention claimed is:

1. A longitudinally coupled resonator type surface acoustic wave filter, comprising a signal terminal, a ground terminal, and an interdigital transducer group, wherein the interdigital transducer group comprises at least a first interdigital transducer and a second interdigital transducer arranged along a first direction; the first interdigital transducer comprises a first busbar, and the second interdigital transducer comprises a second busbar; and the first busbar is electrically connected to the signal terminal via a first signal line, and the second busbar is electrically connected to the ground terminal via a first ground line; and the first ground line and the first signal line do not overlap, wherein the first busbar and the second busbar are arranged along the first direction;

the first interdigital transducer further comprises a third busbar, wherein the third busbar and the first busbar are arranged along a second direction, the third busbar is electrically connected to the ground terminal via a second ground line, and the second direction intersects with the first direction; and the longitudinally coupled resonator type surface acoustic wave filter further comprises at least one electrode finger, wherein the at least one electrode finger extends along the second direction, one end of the at least one electrode finger is electrically connected to the second busbar, and the other end of the at least one electrode finger is electrically connected to the third busbar, wherein the second interdigital transducer further comprises a fourth busbar, and the fourth busbar is arranged with the second busbar along the second direction, and is arranged with the third busbar along the first direction;

the signal terminal is a single-input single-output signal terminal comprising only a single first signal terminal and a single second signal terminal, wherein the first busbar is electrically connected to the first signal terminal via the first signal line, and the fourth busbar is electrically connected to the second signal terminal via a second signal line; and along the first direction, a gap is arranged between the first busbar and the second busbar, and a gap is arranged between the third busbar and the fourth busbar; and the first signal terminal is an input signal terminal, and the second signal terminal is an output signal terminal; or, the first signal terminal is an output signal terminal, and the second signal terminal is an input signal terminal, wherein the ground terminal is located only on a side of the longitudinally coupled resonator type surface acoustic wave filter close to the first signal terminal.

2. The longitudinally coupled resonator type surface acoustic wave filter according to claim 1, wherein the longitudinally coupled resonator type surface acoustic wave filter comprises at least two first interdigital transducers and at least one second interdigital transducer; along the first direction, the at least one second interdigital transducer is located between two adjacent first interdigital transducers;

the first busbars of the two first interdigital transducers are electrically connected to the signal terminal via a same signal line; and the second busbar is electrically connected to at least one third busbar via the at least one electrode finger.

3. The longitudinally coupled resonator type surface acoustic wave filter according to claim 1, wherein the longitudinally coupled resonator type surface acoustic wave filter further comprises a reflector; and along the first direction, the reflector is located on at least one side of the interdigital transducer group, and the reflector is electrically connected to the ground terminal.

4. An elastic wave filter, comprising the longitudinally coupled resonator type surface acoustic wave filters according to claim 1, wherein the longitudinally coupled resonator type surface acoustic wave filter is arranged in series in a loop between the first signal terminal and the second signal terminal; and the elastic wave filter further comprises at least one series arm resonator and at least one parallel arm resonator, wherein the at least one series arm resonator is arranged in series in the loop between the first signal terminal and the second signal terminal, one end of the at least one parallel arm resonator is arranged in the loop between the first signal terminal and the second signal terminal, and another end is electrically connected to the ground terminal.

* * * * *